United States Patent [19]

Schloetterer et al.

[11] 3,997,908
[45] Dec. 14, 1976

[54] SCHOTTKY GATE FIELD EFFECT TRANSISTOR

[75] Inventors: Heinrich Schloetterer, Putzbrunn-Solalinden; Jenoe Tihanyi, Munich, both of Germany

[73] Assignee: Siemens Aktiengesellschaft, Berlin & Munich, Germany

[22] Filed: Mar. 28, 1975

[21] Appl. No.: 563,127

[30] Foreign Application Priority Data

Mar. 29, 1974 Germany .................. 2415408

[52] U.S. Cl. .................. 357/22; 357/4; 357/15; 357/23; 357/49; 357/42
[51] Int. Cl.² .................. H01L 29/80; H01L 29/48; H01L 27/12; H01L 27/02
[58] Field of Search .............. 357/4, 49, 23, 15, 22, 357/42

[56] References Cited

UNITED STATES PATENTS

| | | |
|---|---|---|
| 3,783,052 | 1/1974 | Fisher .................. 357/4 |
| 3,890,632 | 6/1975 | Ham et al. .................. 357/49 |

*Primary Examiner*—Edward J. Wojciechowicz
*Attorney, Agent, or Firm*—Hill, Gross, Simpson, Van Santen, Steadman, Chiara & Simpson

[57] ABSTRACT

A Schottky gate field effect transistor of the type comprising a silicon body of one conductivity type on an insulator substrate, and source, drain and gate electrodes is provided with a pn-junction located parallel to the surface of the substrate which produces a space charge zone occupying the zones of the silicon body close to the substrate surface, and a relatively thin active layer is located between the space charge zone and the gate electrode, the active layer having the same type conductivity as the silicon body.

20 Claims, 4 Drawing Figures

3,997,908

SCHOTTKY GATE FIELD EFFECT TRANSISTOR

BACKGROUND OF THE INVENTION

1. Field of the Invention

This invention is in the file of Schottky gate field effect transistors with the inclusion of a space charge zone in proximity to the interface between the silicon transistor body and the substrate in combination with a thin active layer located between such space charge zone and the gate electrode of the transistor.

2. Description of the Prior Art

Schottky gate field effect transistors also known as MESFET are described in the publications of Drangeid and Sommerhalder (IBM Journal Res. Develop., March 1970, pages 82 to 94) and Mohr (IBM Journal Res. Develop., March 1970, pages 142 to 147). The first publication states that power amplification is possible even in the gigahertz range with such a transistor. For such transistors consisting of silicon, a limiting value of approximately 12 gigahertz was established, and in the case of such transistors constructed from gallium arsenide, 30 gigahertz was considered to be the highest oscillation frequency. In addition to good high frequency properties, a further advantage of the MESFETs is that they can be produced relatively simply with easily reproducible, low threshold voltages.

For integrated circuits, silicon is used as the transistor material. However, circuit elements on a silicon base and circuit elements on a gallium arsenide base cannot be positioned together on a common substrate in a simple fashion and thus the use of MESFETs consisting of gallium arsenide is limited.

The second-named publication discloses the prior art for MESFETs on a silicon base. Previously, silicon having a high electrical resistance had been used as the substrate for the MESFET. On pages 142 and 143 of this publication, it is stated that this type of silicon as a substrate merely represents a compromise because its insulating properties are not ideal. Accordingly, such transistors have been constructed in which the active region is isolated from the exterior, for example, by a ring-shaped source electrode. This closed arrangement, however, occupies a significant amount of space. A further difficulty arises from the fact that the electric properties of the silicon substrate can change during the production of the integrated circuits. Nevertheless, as stated in this publication, silicon MESFETs on silicon substrates are preferred to silicon MESFETs on sapphire substrates and to other heterogeneous silicon MESFETs. The reason for this is that thin silicon layers having a thickness of 0.2 micron or less such as have previously been used for MESFETs cannot be produced with sufficiently high crystallographic and electrical quality on other than silicon substrates.

SUMMARY OF THE INVENTION

The present invention provides high grade silicon MESFETs on insulator substrates which provide higher switching speeds than can be achieved with silicon MESFETs on a silicon substrate.

In accordance with the present invention, relatively thick silicon bodies are employed so that at the surface of the silicon body remote from the substrate, a charge carrier mobility is achieved corresponding to a silicon crystal of high crystal quality. This charge carrier mobility on the surface is achieved in silicon bodies on a sapphire or a spinel substrate where the silicon body has a thickness of approximately 1 micron. The portion of the silicon body close to the substrate is electrically disconnected by the space charge zone which forms as the result of a pn-junction and thus is inactive for the function of the MESFET. The actual active layer which participates in the electrical functioning of the MESFET and which lies between the space charge zone and the surface of the silicon body remote from the substrate can, in accordance with the present invention, be at a thickness of approximately 0.2 microns or less.

As the MESFETs produced in accordance with the present invention are in the form of semiconductor islands on highly insulating substrates, and since the entire metallization for conductor paths and connecting pads likewise lies on a highly insulating substrate, only extremely small parasitic capacitances arise. This is a particular advantage compared with MESFETs on silicon substrates, where the parasitic capacitances are larger due to the residual conductivity of the silicon substrate. Since with the new transistors, the insulation to all regions outside the MESFETs is complete because of the insulated arrangement, no additional shielding or screening measures like guard rings are required. Integrated circuits produced with the MESFETs of the present invention can advantageously be produced with a higher packing density than would be possible in the production of similar devices on silicon substrates.

BRIEF DESCRIPTION OF THE DRAWINGS

Other objects, features and advantages of the invention will be readily apparent from the following description of certain preferred embodiments thereof, taken in conjunction with the accompanying drawings, although variations and modifications may be effected without departing from the spirit and scope of the novel concepts of the disclosure, and in which.

DESCRIPTION OF THE PREFERRED EMBODIMENTS

Figure 1:
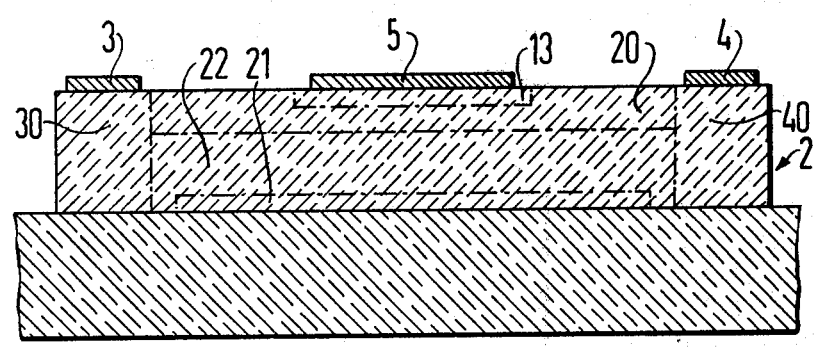
FIG. 1 is a highly magnified cross-sectional view of the transistor produced according to the present invention.

In FIG. 1, there is shown a highly insulating substrate 1 which consists of a spinel or of sapphire on which there is an insular silicon body 2 including a source zone 30 and a drain zone 40 both of which consist of highly n-doped silicon. On these zones 30 and 40 there are provided a source electrode 3 and a drain electrode 4, with a Schottky gate electrode 5 disposed between these two electrodes. The source and drain electrodes 3 and 4 are arranged to be connected to a voltage source for the drain voltage $U_D$. Between source electrode 3 and drain electrode 4 there is an n-doped silicon zone through which the current can flow. The magnitude of the so-called drain current $I_D$, which flows through the semiconductor body can be controlled in a known manner by means of applying a variable electric potential connected to the gate electrode 5. Beneath the gate electrode 5 in the silicon body there is formed a space charge zone 13 which has an electric resistance which is very high in comparison to the other zones of the silicon body and whose width depends upon the magnitude of the electric potential applied to the gate electrode 5. The silicon body consists basically of n-doped silicon. A p-doped silicon layer 21 is arranged at the interface or boundary between the silicon body and the substrate. This layer 21 which may consist of boron ions at a concentration of $10^{14}$ to $10^{17} cm^{-3}$ for instance can be produced in various ways. Because of the pn-junction existing between the p-conducting layer 21 and the n-conducting material of the silicon body, there is formed a space charge zone 22 which, because of its high electric resistance, renders together with the p-layer practically the entire space which it occupies at the boundary of the silicon body to the substrate inactive for the electrical functions of the MESFET. Accordingly, between the gate electrode 5 and the space charge zone 22 there is merely an active layer 20 which is thin in comparison to the thickness of the silicon body.

The p-doped layer 21 can be produced by known epitaxial or ion implantation methods or it may be produced as a p-layer influenced by interface states.

In the first-mentioned procedure, the dopant is added, for example, to a gas mixture from which the silicon layer is deposited in oriented fashion. The dopant is then deposited with the layer and is incorporated into its lattice. In the second-named procedure, ions of the dopants are bombarded into the partly or completely deposited silicon body. A p-layer induced by interfacial states can be produced by obtaining an interface charge of negative charged states on the surface of the substrate 1. This can be accomplished for example, in the case of a magnesium-aluminum spinel substrate by heat treating the same in a hydrogen atmosphere for approximately 5 minutes at approximately 1100° to 1200° C. prior to epitaxial deposition.

The upper, n-doped part of the silicon body can also be produced by epitaxial growth or by ion implantation. It is also possible to produce this part by diffusion. In this case, the doping material is applied to the silicon body in the known manner and introduced into the silicon to a desired penetration depth by heating.

As in the case of known integrated circuits, the electrode metal for the MESFETs can be aluminum. If transistors are to be produced in which no drain current is to flow at zero gate voltage, other metals and compounds can also be used for the gate electrode. For example, platinum silicide can be used as a gate electrode material to control the level of gate voltage at which a current can flow through the transistor from the source electrode to the drain electrode.

The silicon body as shown in FIG. 1 has a thickness of aproximately 1 micron, preferably between 0.5 and 1.5 microns. The p-doped layer 21 was produced by doping during the epitaxial growth, and the n-doping of the silicon body was produced by diffusion. The charge carrier concentration $N_n$ of the negative charge carriers of the n-doped silicon body amounted to approximately $10^{17} .cm^{-3}$. The lower p-doped layer 21 possessed such a carrier concentration $N_p$ of the positive charge carrier preferably $10^{14}$ to $10^{15} cm^{-3}$ that the space charge zone 22 extends up to the substrate 1. At the boundary of the silicon body to the substrate a layer of approximately 0.3 to 0.8 microns, depending upon the total thickness of the silicon body 2, is excluded from the transistor function. In another example the p-layer can be higher doped, preferably $10^{16}$ to $10^{17} cm^{-3}$, and thicker, so that the thickness of space charge layer and p-layer are together approximately 0.3–0.8 $\mu$m.

Figure 2:
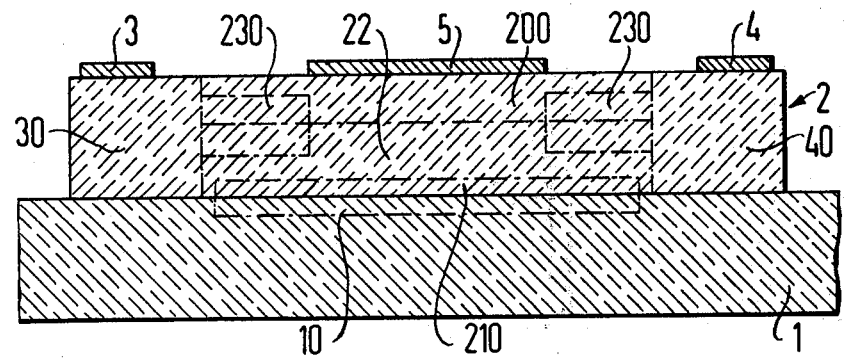
FIG. 2 is a view similar to FIG. 1 of a modified form of the present invention.

A particularly preferred embodiment is shown in FIG. 2. There the substrate 1 is provided with a silicon body 2 having a thickness of approximately 1 micron, and including a source zone 30, a drain zone 40, a drain electrode 3, a source electrode 4 and a gate electrode 5. The surface of the substrate facing the semiconductor body possesses a surface charge in the form of negative interface states 10. These interface states can be produced in the manner previously described. These charges influence a p-layer 210 in the silicon body. The surface density of the surface states was at a value of more than $10^{11} cm^{-2}$ preferably of about $1-3.10^{12} cm^{-2}$. The silicon body is of n-type and relatively low doped, for example, at a value of less than $10^{16} cm^{-3}$, preferably 1 to $5.10^{15} cm^{-3}$ in the regions adjacent to the substrate. As a result of the relatively low doping, the space charge zone 22 achieves a considerable width. With the aid of ion implantation, a thick active layer 200 of approximately 0.2 microns of thickness is doped to a value of $N_n$ of $10^{17} cm^{-3}$ under the influence of the silicon body facing away from the substrate within the silicon body. In the regions 30 and 40, the silicon body is higher doped, preferably to $10^{19}$ to $10^{20} cm^{-3}$, in its entire thickness by means of diffusion. After the implantation, heat treating is carried out at, for example, 900° C in order to activate the implanted ions, i.e., the ions introduced into the layer are electrically activated by the action of heat.

Next, the production of the metal electrodes takes place. Subsequently, a further whole area implantation occurs wherein the source, drain and gate electrodes are used as covering masks. Additional charge carriers are implanted between the source electrode and the gate electrode and between the drain electrode and the gate electrode. A maximum charge carrier concentration of approximately $10^{19} cm^{-3}$ to $10^{20} cm^{-3}$ is provided inside the silicon body. In this way, highly n-doped zones 230 with a high electrical conductivity are obtained in these areas of the silicon body. Close to the surface of the silicon body underlying the gate electrode, the charge carrier concentration must be less than $10^{17} cm^{-3}$ so that the Schottky-gate breakdown voltage is not affected.

Like the preceding example the p-layer doped to about $10^{14}$ to $10^{17} cm^{-3}$ also can be produced by ion implantation of boron or by epitaxy, having a thickness of less than 0.8 microns.

Figure 3:
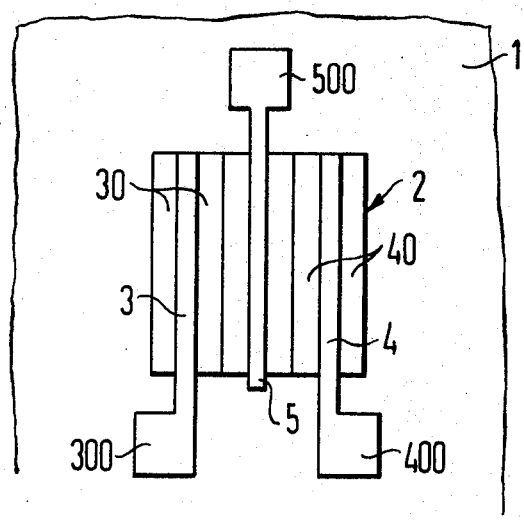
FIG. 3 is a plan view of a transistor produced in accordance with the present invention.

FIG. 3 shows a MESFET produced in accordance with the present invention in a plan view. It will be seen that the gate electrode 5 extends over the full width of the silicon body. All of the electrodes have terminals thereon for connection to other circuit components, the source electrode being connected to the terminal 300, the gate electrode to the terminal 500 and the drain electrode to the terminal 400. Other circuit arrangements can be used for the same substrate 1 on which the MESFET is provided, and the MESFET can be electrically connected to other circuit elements in other known manners.

The preceding examples relate to MESFETs having n-type silicon in the active part of the transistor. It is also possible, however, to produce p-type transistors which can be provided, for example, with hafnium as the Schottky gate electrode material. The suitability of hafnium for this use has been described by Saxena in "Applied Physics Letters", Vol 19 (1971) pages 71 to 73.

The p-type transistors can be constructed in the manner described in connection with the n-type MESFETs on insulators interchanging the p-doped zones for the n-doped zones and vice versa. In the case of the boundary traps, those having positive signs must be produced so that they influence an n-conducting layer. These boundary traps can, for example, be produced by using sapphire as a substrate and heat treating the same for approximately 5 minutes in hydrogen at approximately 1100° to 1300° C., prior to epitaxy.

By combining both MESFET types in one circuit, the transistors in accordance with the present invention can be used to construct complementary circuits, i.e., circuits which contain both n-type transistors and p-type transistors.

Figure 4:
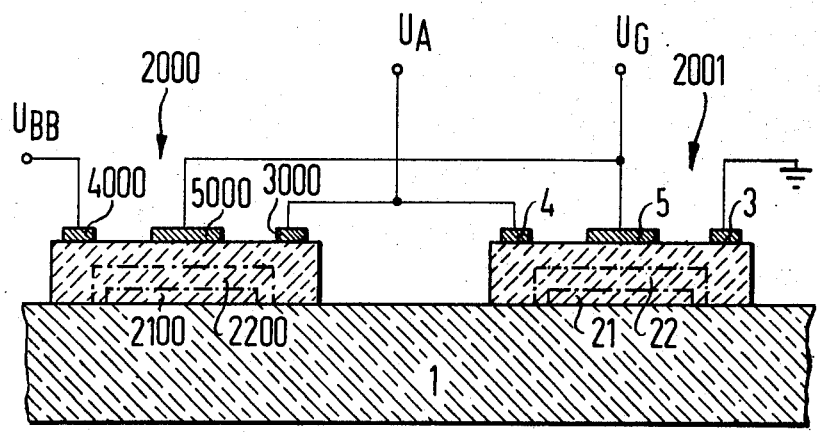
FIG. 4 is a schematic view illustrating a circuit arrangement including two complementary transistors produced according to the present invention.

FIG. 4 illustrates a circuit which can be used as an inverter. A common substrate is provided with a p-type transistor 200 and an n-type transistor 2001. The p-type transistor has an n-doped layer 2100 and the n-type transistor has a p-doped layer 21 at its interface with the substrate. The space charge zones are indicated at reference numerals 2200 and 22, respectively. The n-type transistor has a source electrode 3, a drain electrode 4 and a gate electrode 5 all of which may be composed, for example, of aluminum. The p-type transistor has a source electrode 3000, a drain electrode 4000, both consisting, for example, of aluminum, and a gate electrode 5000 which may consist of hafnium. The two transistors are, as shown, connected to each other with the source electrode 3 of the n-type transistor being at ground potential and the drain electrode 4000 of the p-type transistor carrying a voltage $U_{BB}$, which is positive with respect to ground. An output potential $U_A$ is at ground potential or the value $U_{BB}$ depending upon whether the gate electrodes are fed with a voltage $U_G$ which is negative or positive with respect to ground. The electrical connection lines which are represented schematically in FIG. 4 can, for example, be produced by well known vapor deposition techniques.

It should be obvious that various modifications can be made to the described embodiments without departing from the scope of the present invention.

We claim as our invention:

1. In a Schottky gate field effect transistor comprising a silicon body of one conductivity type on an insulator substrate, and source, drain and gate electrodes, the improvement which comprises a pn-junction located parallel to the surface of said substrate which produces a space charge zone extending to the surface of said substrate beyond the perimeter of said gate electrode, a relatively thin active layer located between said space charge zone and the gate electrode, said active layer having the same type conductivity as the silicon body and the source and drain areas, and a layer of opposite conductivity type disposed at the interface between said silicon body and said insulator substrate said pn-junction being formed by said layer of opposite conductivity type and said body.

2. A transistor as claimed in claim 1 in which said silicon body is n-conducting.

3. A transistor as claimed in claim 2 including a layer of p-conducting silicon disposed in close proximity to the interface between said silicon body and said insulator substrate.

4. A transistor as claimed in claim 3 which includes an area of negative surface charges in the surface of said substrate at said interface which influences said layer of p-conducting silicon.

5. A transistor as claimed in claim 1 in which said silicon body is p-conducting.

6. A transistor as claimed in claim 5 including a layer of n-conducting silicon disposed in close proximity to the interface between said silicon body and said insulator substrate.

7. A transistor as claimed in claim 3 wherein said p-conducting silicon is produced by implantation of boron ions to a charge carrier concentration of $10^{14}-10^{17}\text{cm}^{-3}$.

8. A transistor as claimed in claim 3 wherein said p-conducting silicon is produced during epitaxial deposition of said silicon body.

9. A transistor as claimed in claim 6 wherein said n-conducting silicon is produced by implantation of ions.

10. A transistor as claimed in claim 6 wherein said n-conducting silicon is produced during epitaxial deposition of said silicon body.

11. A transistor as claimed in claim 10 which includes an area of positive surface charge in the surface of said substrate at said interface which influences said layer of n-conducting silicon.

12. A transistor as claimed in claim 1 in which said insulator substrate is a spinel.

13. A transistor as claimed in claim 12 in which said spinel is a magnesium-aluminum spinel.

14. A transistor as claimed in claim 1 in which said insulating substrate is a sapphire.

15. A transistor according to claim 1 which includes highly doped zones of the same conductivity type as the silicon body between the source and gate electrodes and between the gate and drain electrodes.

16. A transistor according to claim 15 which includes a highly doped active layer in said silicon body of the same conductivity type as the silicon body remote from the interface between said silicon body and said substrate.

17. A transistor according to claim 15 in which said highly doped zones have charge carrier concentrations of approximately $10^{19}\text{cm}^{-3}$ to $10^{20}\text{cm}^{-3}$.

18. A transistor according to claim 16 in which the highly doped active layer has a charge carrier concentration of approximately $10^{17}\text{cm}^{-3}$.

19. A transistor according to claim 1 in which the silicon body possesses a charge carrier concentration of less than $10^{16}\text{cm}^{-3}$.

20. A transistor according to claim 4 in which said area of surface charges in the substrate is produced by heat treating the substrate in a hydrogen atmosphere at about 1100° C to 1300° C.

* * * * *